(12) United States Patent
Tyrrell et al.

(10) Patent No.: US 8,981,840 B1
(45) Date of Patent: Mar. 17, 2015

(54) REDUCTION IN ON-RESISTANCE IN PASS DEVICE

(71) Applicant: Dialog Semiconductor GmbH, Kirchheim/Teck-Nabern (DE)

(72) Inventors: Julian Tyrrell, Swindon (GB); Ambreesh Bhattad, Swindon (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 14/028,735

(22) Filed: Sep. 17, 2013

(30) Foreign Application Priority Data

Sep. 10, 2013 (EP) .................................. 13368030

(51) Int. Cl.
*G05F 1/10* (2006.01)
*G05F 3/02* (2006.01)
*G05F 3/16* (2006.01)

(52) U.S. Cl.
CPC ........................................ *G05F 3/16* (2013.01)
USPC ............ 327/538; 327/540; 327/541; 323/277; 323/280

(58) Field of Classification Search
USPC .................... 327/538, 540, 541; 323/277, 280
See application file for complete search history.

(56) References Cited

U.S. PATENT DOCUMENTS

| | | | |
|---|---|---|---|
| 5,821,697 A | 10/1998 | Weber | |
| 7,102,415 B1 | 9/2006 | Potanin et al. | |
| 7,242,565 B2 * | 7/2007 | Yoshio | 361/103 |
| 8,018,200 B2 | 9/2011 | Enjalbert et al. | |
| 8,089,305 B2 * | 1/2012 | Matano | 327/142 |
| 8,416,012 B2 * | 4/2013 | Ashida | 327/540 |
| 2001/0045841 A1 | 11/2001 | Kondo et al. | |
| 2006/0017494 A1 * | 1/2006 | Horiguchi et al. | 327/538 |
| 2007/0064513 A1 * | 3/2007 | Matano | 365/226 |
| 2007/0222502 A1 | 9/2007 | Noda | |
| 2008/0094037 A1 | 4/2008 | Enjalbert et al. | |
| 2012/0268094 A1 | 10/2012 | Scaldaferri et al. | |

FOREIGN PATENT DOCUMENTS

JP    2009 193401    8/2009
WO   WO 2008/019391    2/2008

OTHER PUBLICATIONS

"A Method for Reducing the Variation in "On" Resistance of a MOS Sampling Switch," by A. K. Ong et al., ISCAS 2000—IEEE International Symposium on Circuits and Systems, May 28-31, 2000, Geneva, Switzerland, pp. V-437 to V-440.
"A Low-Voltage, Low Quiescent Current, Low Drop-Out Regulator," by Gabriel A. Rincon-Mora et al. IEEE Journal of Solid State Circuits, vol. 33, No. 1, Jan. 1998, pp. 36-44.
European Search Report, Dialog Semiconductor GmbH, 13368030.6-1807, Mailed: Feb. 6, 2014.

* cited by examiner

*Primary Examiner* — Kenneth B. Wells
(74) *Attorney, Agent, or Firm* — Saile Ackerman LLC; Stephen B. Ackerman

(57) ABSTRACT

A pass device configured from a common gate transistor, wherein an input voltage is applied to the source and an output at the drain is applied to a load. The input resistance of the pass device increases as the input voltage is reduced and limits the useful range of the input voltage. Increasing the gate to source voltage (Vgs) by applying a negative voltage to the gate reduces the input resistance and increases the range of operation of the pass device.

14 Claims, 2 Drawing Sheets

REDUCTION IN ON-RESISTANCE IN PASS DEVICE

1. TECHNICAL FIELD

The present disclosure is related to on-resistance of a transistor device, in particular the internal on-resistance of a pass device.

2. BACKGROUND

A pass device is used to transmit a voltage, or signal, from one portion of a circuit to another and much of the time a wide range of signal voltage is in play. To compensate for increasing internal resistance of the pass device, bias and circuit techniques need to be deployed. Further, any internal resistance in the pass device needs to be compensated for, and therefore a means to reduce the resistance that a signal sees flowing through the pass device needs to be reduced to the lowest level possible.

US 2012/0268094 A1 (Scalaferri et al.) is directed to circuits and methods for dynamic adjustment of the current limit of a power management unit to avoid automatic interruption of power flow. US 2008/0094037 A1 (Enjalbert et al.) is directed to a number of measures to avoid excessive power dissipation by a pass device in a charging system. In U.S. Pat. No. 8,018,200 B2 (Enjalbert et al.) a number of measures are directed to avoiding excessive power dissipation in a charging system by a pass device. U.S. Pat. No. 7,102,415 B1 (Potanin) is directed to a current trip point detection circuit for change in current through a pass transistor to a load. U.S. Pat. No. 5,821,697 (Weber) is directed to instant levels of power flow between a light source and a battery dynamically controlled.

A first technical paper: A. K. Ong, V. I. Prodanov, M. Tarsia; "A Method for Reducing the Variation in "On" Resistance of a MOS Sampling Switch; Bell Laboratories, Lucent Technologies; IEEE International Symposium on Circuits and Systems, May 28-31, 2000, Geneva, Switzerland. A second technical paper: G. A. Rincon-Mora and P. E. Allen, "A low drop out Quiesant Current, Low Drop-Out Regulator", IEEE Journal of Solid State Circuits, Vol 33, No. 1, January 1998. Boosting Technique:

SUMMARY

It is an objective of the present disclosure to reduce the on-resistance of a pass device while operating over a wide range of input voltages and while using a high-voltage MOS device with a reduced on-resistance and an increased threshold voltage.

It is further an objective of the present disclosure to increase the Vgs voltage by using a voltage negative of the Vss rail.

It is also further an objective of the present disclosure to produce the voltage negative of the Vss rail by using a negative charge pump.

It is still an objective of the present disclosure to detect when the voltage negative of the Vss rail is operational.

The pass device of the present disclosure is a common gate configuration where the gate is connected to Vss (0V), the source is connected to the pass gate input (Vsupply) and the drain is connect to the pass gate load producing Vload. It is an objective to produce a Vload that is as close to Vsupply as possible. To accomplish this, the internal resistance of the pass gate needs to be as low as possible. As the input voltage to the pass gate is reduced, the input resistance of the pass gate increases as Vgs decreases. To counter the increase in input resistance at low input voltage, the gate to source voltage (Vgs) of the pass device is increased by changing the gate bias to be a negative voltage below Vss.

A gate bias circuit comprising the capability to switch between Vss and an output of a negative charge pump is coupled to the gate of the PMOS pass device. The gate bias circuit provides the capability to operate at a gate bias of Vss (0V), or switch to a gate bias that is negative with respect to Vss. Whereas, several circuits which include negative charge pumps, a −1× multiplier circuit provides a circuit that provides Vss and when directed a voltage bias that is more negative than Vss. The gate bias circuit defaults to Vss when a negative bias is not called for.

BRIEF DESCRIPTION OF THE DRAWINGS

This invention will be described with reference to the accompanying drawings, wherein.

DETAILED DESCRIPTION

Figure 1:
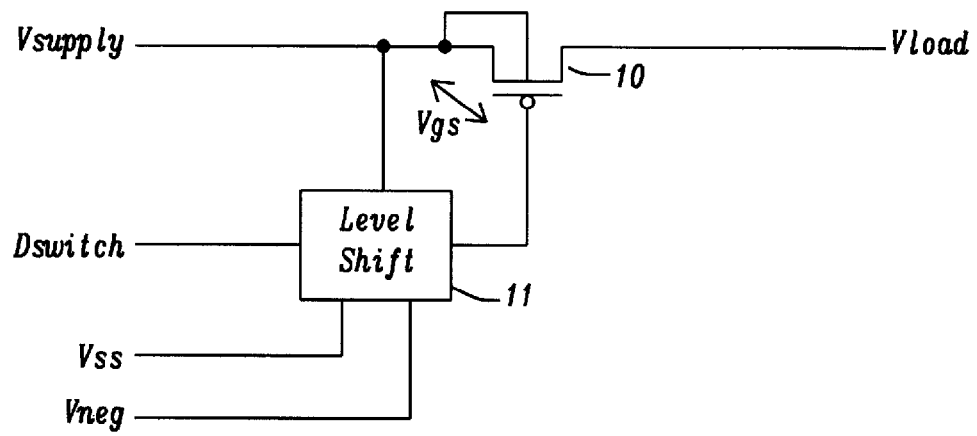
FIG. 1 is a circuit diagram of the present disclosure using a level shift to control the gate bias of the pass gate.

In FIG. 1 is shown a circuit diagram of a pass device 10 of the present disclosure in which Vsupply is being switched to the output, Vload. The bias of the gate voltage of the pass device is normally Vss (0V), but as the input, Vsupply, is reduced in amplitude, the internal resistance of the pass device increases. At some point the increase in internal resistance becomes a problem, reducing the efficiency of the pass device to deliver to the output a load voltage that is a close approximation of Vsupply. The negative voltage, Vneg, that is connected to the level shift circuit 11 is created by negative voltage circuits represented by negative charge pump circuits or a negative one × multiplier circuit (−1× circuit). The level shift circuit is powered from Vsupply to allow the pass transistor to be turned off. In order to turn the device off, the gate must be at the higher of the drain/source voltages; i.e., the source in this case which is also the bulk connection.

Figure 2:
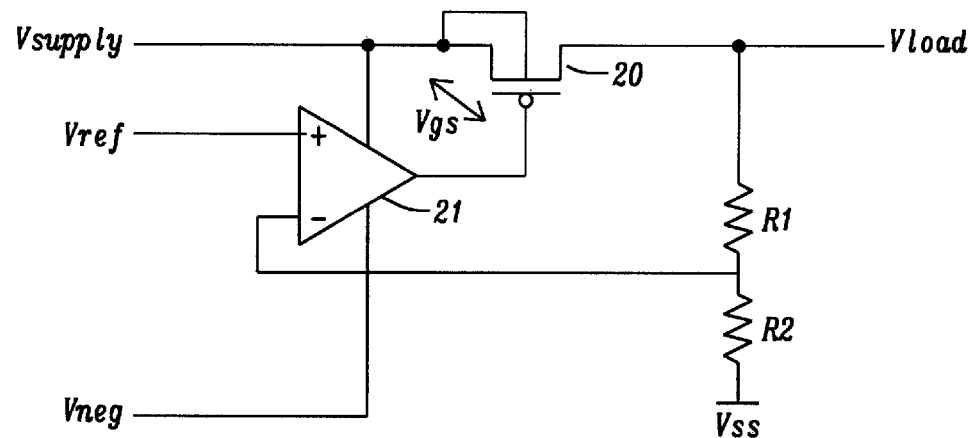
FIG. 2 is a circuit diagram of a pass gate circuit that uses a negative voltage to increase the Vgs of the pass gate of the present disclosure.

In FIG. 2 is a pass gate circuit that uses a negative voltage to increase the Vgs of the pass gate 20 and thereby reduce input resistance allowing a larger range of load currents. When the input, Vsupply, is high, the output, Vload, is high yielding a voltage divider feedback from R1 and R2 to the negative input to the amplifier 21 to be high, which in turn sets the gate bias of the pass device 20 to be negative.

FIG. 2 is an example of a linear regulator using the concept of the higher gate drive from the −1× multiplier. Regulation is achieved from the amplifier 21 in a feedback configuration where the output of the divider circuit (R1/R2) is controlled to be equal to the reference voltage, Vref. The Vref voltage is typically from a bandgap voltage and is stable and fixed over temperature range and supply voltage variations. By allowing the controlling amplifier 21 the capability of a negative output voltage, the on-resistance of the pass device can be lowered thereby allowing either an increase in the output current drive or allowing a smaller pass device to be used.

Figure 3A:
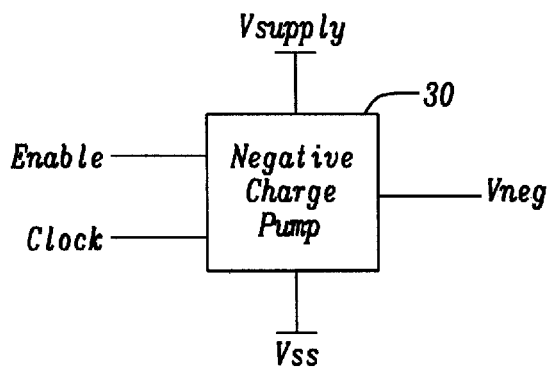
FIG. 3A is a block diagram of a negative charge pump circuit of the present disclosure.
Figure 3B:
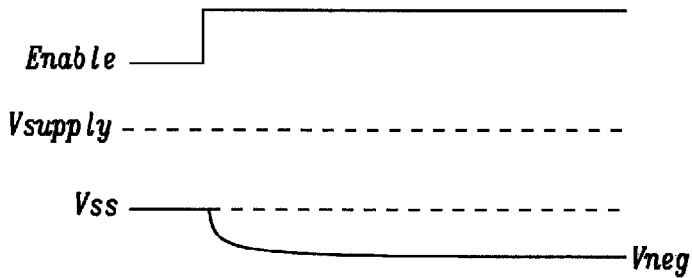
FIG. 3B is a voltage diagram of the negative charge pump circuit of the present disclosure.

In FIG. 3A is shown a block diagram of a negative charge pump 30 of the present disclosure. The negative charge pump 30 is connected between Vsupply and Vss (0V) with a clock, an enable input and a Vneg output. The enable signal turns on the negative charge pump and the clock input provides the switching. FIG. 3B shows the timing of waveforms. Both Vss and Vsupply are constant voltages, and when the enable signal occurs, Vneg is started. The output Vneg is a direct multiple of Vsupply, for instance an inversion of −1×, or the output is a regulated negative voltage controlled by a feedback loop.

Figure 4:
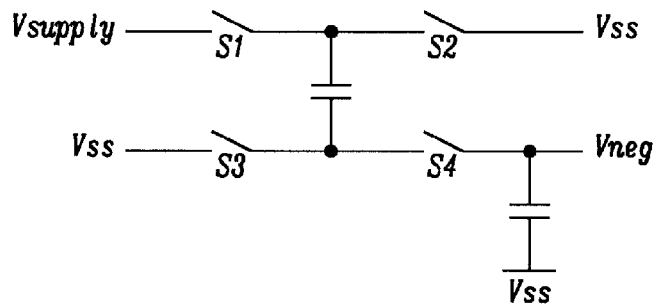
FIG. 4 is a circuit diagram of a single stage switched capacitor circuit capable of producing a negative voltage bias of the present disclosure.

When the negative charge pump is turned off, the output is switched to Vss to provide a low resistance path to Vss, for instance the −1× multiplier circuit shown in FIG. 4 and the switch state shown in TABLE 1. When the charge pump is enabled the switched capacitor inverts the supply voltage, Vsupply, to the negative output voltage.

TABLE I

| Switch | Enable = 0 | Enable = 1<br>Clock = 0 | Enable = 1<br>Clock = 0 |
|---|---|---|---|
| S1 | Closed | Closed | Open |
| S2 | Open | Open | Closed |
| S3 | Closed | Closed | Open |
| S4 | Closed | Open | Closed |

Figure 5:
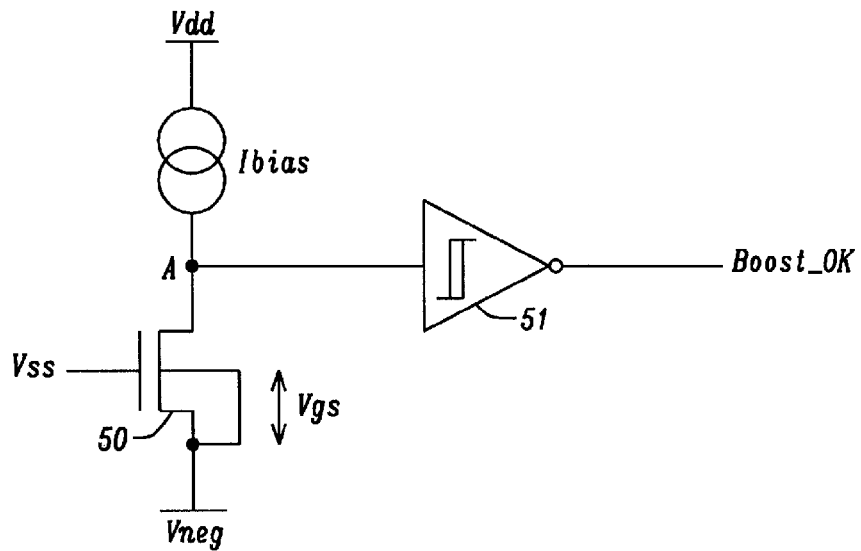
FIG. 5 is a circuit diagram of the present disclosure of a detector circuit for sensing when the negative bias is operational.

In order to detect that the output in FIG. 3A is operating as the negative voltage, Vneg, a sense circuit shown in FIG. 5 is used in which a gate of an N channel device is connected to Vss. When Vneg is more negative than Vgs the N channel device 50 conducts the bias current, Ibias. Node A is pulled low and the output of the Schmitt trigger 51 goes high, which can be used to indicate that the Vneg bias is being applied to the gate of the pass device.

While the invention has been particularly shown and described with reference to preferred embodiments thereof, it will be understood by those skilled in the art that various changes in form and details may be made without departing from the spirit and scope of the invention.

What is claimed is:

1. A pass device, comprising:
   a) a P-channel transistor;
   b) a source of the P-channel transistor capable of receiving an input supply voltage;
   c) a drain of the P-channel transistor capable of providing an output voltage to a load; and
   d) an increase in gate-to-source voltage (Vgs) capable of reducing input resistance of the P-channel transistor;
   e) wherein a negative one times multiplier (−1×) circuit provides the gate of the P-channel transistor with a bias capable of increasing (Vgs) and capable of being switched between Vss (0V) and the negative voltage created by the −1× circuit.

2. The device of claim 1, wherein Vgs is capable of being increased by a compare circuit comparing a resistor divided output load voltage to a reference voltage.

3. The device of claim 2, wherein said reference voltage is a bandgap voltage.

4. The device of claim 2, wherein the compare circuit is capable of producing a negative pass gate voltage to increase Vgs.

5. The device of claim 1, wherein Vgs is capable of being increased by applying the bias that is negative with respect to circuit ground to a gate of the P-channel transistor.

6. The device of claim 5, wherein said negative bias capable of being created by a negative charge pump or the negative one times multiplier (−1×) circuit.

7. The device of claim 1, wherein said input resistance increases when Vgs decreases, which results from said input supply voltage that is reduced.

8. A pass device, comprising:
   a) a P-channel transistor;
   b) a source of the P-channel transistor capable of receiving an input supply voltage;
   c) a drain of the P-channel transistor capable of providing an output voltage to a load;
   d) an increase in gate-to-source voltage (Vgs) capable of reducing input resistance of the P-channel transistor; and
   e) wherein Vgs is capable of being increased by applying a bias that is negative with respect to circuit ground to a gate of the P-channel transistor, wherein said negative bias capable of being created by a negative charge pump or a negative one times multiplier (−1×) circuit, and wherein the −1× circuit provides the gate with bias capable of being switched between Vss (0V) and the negative voltage created by the (−1×) circuit.

9. A method for reducing input resistance of a pass gate, comprising;
   a) connecting a bias to a gate of the pass gate;
   b) connecting an input supply voltage to a source of the pass gate; and
   c) switching said bias from zero volts (Vss) to a negative bias voltage capable of increasing gate-to-source voltage (Vgs) and thereby capable of reducing input resistance of the pass gate.

10. The method of claim 9, wherein said input resistance is capable of increasing as input supply voltage decreases.

11. The method of claim 9, wherein said negative bias voltage capable of reducing input resistance is created by a negative charge pump circuit or a negative one times multiplier (−1×) circuit.

12. The method of claim 11, wherein said −1× circuit provides said bias capable of switching between Vss (0V) and said negative voltage.

13. The method of claim 9, wherein said negative bias voltage capable of reducing input resistance is created by a comparison circuit comparing a resistor divided output with a bandgap reference voltage.

14. The method of claim 9, wherein said negative bias voltage capable of being detected by a circuit comprising a Schmitt trigger and an N-channel transistor.

* * * * *